(12) United States Patent
Wang et al.

(10) Patent No.: US 11,948,396 B2
(45) Date of Patent: Apr. 2, 2024

(54) DISPLAY ASSEMBLY AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Fengxian Wang, Beijing (CN); Chuanyan Lan, Beijing (CN); Qiang Tang, Beijing (CN); Jing Gao, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/789,221

(22) PCT Filed: Aug. 12, 2021

(86) PCT No.: PCT/CN2021/112346
§ 371 (c)(1),
(2) Date: Jun. 27, 2022

(87) PCT Pub. No.: WO2022/068419
PCT Pub. Date: Apr. 7, 2022

(65) Prior Publication Data
US 2023/0031991 A1    Feb. 2, 2023

(30) Foreign Application Priority Data

Sep. 30, 2020  (CN) .......................... 202011061268.8

(51) Int. Cl.
*G06V 40/13*  (2022.01)
*H05K 1/18*   (2006.01)
(Continued)

(52) U.S. Cl.
CPC ......... *G06V 40/1318* (2022.01); *H05K 1/189* (2013.01); *H10K 50/87* (2023.02);
(Continued)

(58) Field of Classification Search
CPC ...................................................... G06V 40/13
See application file for complete search history.

(56) References Cited

U.S. PATENT DOCUMENTS

2017/0364726 A1   12/2017  Buchan et al.
2019/0080140 A1    3/2019  Lee et al.
(Continued)

FOREIGN PATENT DOCUMENTS

CA      3024317 A1    12/2017
CN    105160230 A     12/2015
(Continued)

OTHER PUBLICATIONS

International Search Report and Written Opinion dated Nov. 12, 2021, in corresponding PCT/CN2021/112346, 9 pages.
(Continued)

*Primary Examiner* — Joseph R Haley
(74) *Attorney, Agent, or Firm* — XSENSUS LLP

(57) ABSTRACT

A display assembly and a display apparatus. The display assembly comprises a display panel, a first flexible circuit board and a fingerprint sensor, wherein the first flexible circuit board is connected to the display panel in a binding manner and is positioned on the side of the display panel that faces away from a display surface; a display signal line coupled to the display panel is arranged on the first flexible circuit board; the fingerprint sensor is fixed on the side of the first flexible circuit board that is close to the display panel, and a light-sensitive surface of the fingerprint sensor is close to the display panel; and at least some sections of at least some fingerprint identification signal lines in fingerprint (Continued)

identification signal lines connected to the fingerprint sensor are arranged on the first flexible circuit board.

18 Claims, 6 Drawing Sheets

(51) Int. Cl.
 *H10K 50/87* (2023.01)
 *H10K 59/00* (2023.01)
 *H10K 59/131* (2023.01)
(52) U.S. Cl.
 CPC ............ *H10K 59/00* (2023.02); *H10K 59/131* (2023.02); *H05K 2201/10128* (2013.01)

(56) References Cited

U.S. PATENT DOCUMENTS

| 2019/0296266 | A1* | 9/2019 | Kim | ................ H10K 59/40 |
| 2020/0218920 | A1 | 7/2020 | Guo | |
| 2021/0004117 | A1 | 1/2021 | Kim et al. | |

FOREIGN PATENT DOCUMENTS

| CN | 107564416 A | 1/2018 |
| CN | 109062333 A | 12/2018 |
| CN | 109492517 A | 3/2019 |
| CN | 109508593 A | 3/2019 |
| CN | 111324182 A | 6/2020 |
| CN | 112183396 A | 1/2021 |
| EP | 3454167 A1 | 3/2019 |
| EP | 3472751 A1 | 4/2019 |
| EP | 3716008 A1 | 9/2020 |
| IN | 111433708 A | 7/2020 |
| WO | 2017/218228 A1 | 12/2017 |
| WO | 2019/037593 A1 | 2/2019 |
| WO | 2020/020059 A1 | 1/2020 |

OTHER PUBLICATIONS

Office Action dated May 27, 2023 in Chinese Patent Application No. 202011061268.8, 16 pages.

* cited by examiner

DISPLAY ASSEMBLY AND DISPLAY APPARATUS

CROSS REFERENCE

The present disclosure is based upon International Application No. PCT/CN2021/112346 filed on Aug. 12, 2021, which claims priority to Chinese Patent Application No. 202011061268.8, filed on Sep. 30, 2020 and entitled "DISPLAY ASSEMBLY AND DISPLAY APPARATUS", which is incorporated herein by reference in its entirety.

TECHNICAL FIELD

The present disclosure relates to the field of display technology, and in particular, to a display assembly and a display apparatus including the same.

BACKGROUND

At present, technologies such as under-screen fingerprint recognition are becoming favored by users, and more and more terminals have adopted the under-screen fingerprint recognition technology, in order to realize the full-screen display of an OLED.

However, a fingerprint recognition sensor for the under-screen fingerprint recognition is attached in individual process, which will cause an increase in manpower and material resources, resulting in higher processing cost.

It should be noted that the information disclosed in above section is only for enhancement of understanding of the background of the present disclosure, and thus may include information that does not constitute the prior art known to those of ordinary skill in the art.

SUMMARY

An object of the present disclosure is to provide a display assembly and a display apparatus including the same, thereby overcoming, at least to a certain extent, one or more problems caused by limitations and disadvantages of the related art.

According to one aspect of the present disclosure, there is provided a display assembly, including:
 a display panel;
 a first flexible printed circuit bound to the display panel, and located on a side of the display panel away from a display surface, wherein a display signal line coupled to the display panel is provided on the first flexible printed circuit; and
 a fingerprint sensor fixed on a side of the first flexible printed circuit close to the display panel, wherein a photosensitive surface of the fingerprint sensor is close to the display panel;
 wherein at least part of segments of at least part of fingerprint recognition signal lines coupled to the fingerprint sensor are arranged on the first flexible printed circuit.

In an example embodiment of the present disclosure, a first connection part and a second connection part are provided on the first flexible printed circuit; and the display assembly further includes:
 a second flexible printed circuit including a third connection part, a fourth connection part, and a connecting line part electrically coupling the third connection part with the fourth connection part;
 wherein the first connection part is butted with the third connection part, and the second connection part is butted with the fourth connection part.

In an example embodiment of the present disclosure, a display signal is transmitted through the first flexible printed circuit, and a fingerprint recognition signal is transmitted through the second flexible printed circuit; or
 the fingerprint recognition signal is transmitted through the first flexible printed circuit, and the display signal is transmitted through the second flexible printed circuit.

In an example embodiment of the present disclosure, the second flexible printed circuit is fixed on a side of the first flexible printed circuit away from the display panel.

In an example embodiment of the present disclosure, the second flexible printed circuit includes:
 a first protection layer;
 a first conductor layer including a conductor part and at least two connection parts, wherein the conductor part and the at least two connection parts are arranged on one side of the first protection layer; the at least two connection parts arranged on two opposite sides of the conductor part; a gap is provided between the connection parts and the conductor part; orthographic projections of the connection parts on the first flexible printed circuit and an orthographic projection of the first protection layer on the first flexible printed circuit do not overlap with each other; a gap is provided between the connection parts; and first through holes are provided on the connection parts;
 an insulation layer arranged on a side of the first conductor layer away from the first protection layer, wherein at least two second through holes are respectively provided at two opposite ends of the insulation layer; a metal layer is formed on walls of the second through holes; and the second through holes communicate with the first through holes;
 a second conductor layer arranged on a side of the insulation layer away from the first protection layer, wherein the second conductor layer includes the connecting line part; at least two third through holes are respectively provided at both ends of the second conductor layer; the connecting line part includes a plurality of connecting lines, both ends of each of the connecting lines being respectively coupled to the third through holes; and the third through holes communicate with the first through holes; and
 a second protection layer arranged on a side of the second conductor layer away from the first protection layer, wherein two opposite ends of the second conductor layer protrude from the second protection layer to expose the third through holes;
 wherein the metal layer in the second through holes couples the connection parts of the first conductor layer and the connecting line part of the second conductor layer to form the third connection part and the fourth connection part.

In an example embodiment of the present disclosure, the display assembly further includes:
 solder paste pillars penetrating through the third through holes, the second through holes and the first through holes of the second flexible printed circuit, and coupled to the first flexible printed circuit, so that the second flexible printed circuit is kept in electrical connection with the first flexible printed circuit.

In an example embodiment of the present disclosure, the conductor part is provided as a whole piece of metal sheet.

In an example embodiment of the present disclosure, the display assembly further includes:

an electromagnetic interference shielding layer arranged between the second flexible printed circuit and the first flexible printed circuit.

In an example embodiment of the present disclosure, the display assembly further includes:

an adhesive layer arranged between the electromagnetic interference shielding layer and the first flexible printed circuit.

In an example embodiment of the present disclosure, the display assembly further includes:

a second flexible printed circuit, wherein the second flexible printed circuit and the first flexible printed circuit are fabricated on the same base substrate, and the second flexible printed circuit and at least part of layers of the first flexible printed circuit are arranged in the same layer;

wherein, the first flexible printed circuit is electrically coupled to a display drive processor through a first connector; and one end of the second flexible printed circuit is coupled to the fingerprint sensor, and the other end is electrically coupled to a fingerprint recognition processor through a second connector.

In an example embodiment of the present disclosure, the display assembly further includes:

a sponge rubber layer arranged around the fingerprint sensor.

In an example embodiment of the present disclosure, the display assembly further includes:

a heat dissipation film arranged between the display panel and the first flexible printed circuit, wherein a via hole is provided on the heat dissipation film, and an orthographic projection of the fingerprint sensor on the display panel is located within an orthographic projection of the via hole on the display panel.

According to one aspect of the present disclosure, there is provided a display apparatus including any of the display assemblies described above.

Other features and advantages of the present disclosure will become apparent from the following detailed descriptions, or be learned in part through practice of the present disclosure.

It is to be understood that the foregoing general descriptions and the following detailed descriptions are exemplary and explanatory only and are not restrictive of the present disclosure.

BRIEF DESCRIPTION OF THE DRAWINGS

The drawings, which are incorporated and constitute a part of the specification, illustrate embodiments consistent with the present disclosure and serve to explain the principles of the present disclosure together with the specification. Obviously, the drawings in the following descriptions are only some embodiments of the present disclosure, and for those of ordinary skill in the art, other drawings can also be obtained from these drawings without creative efforts.

Figure 1:
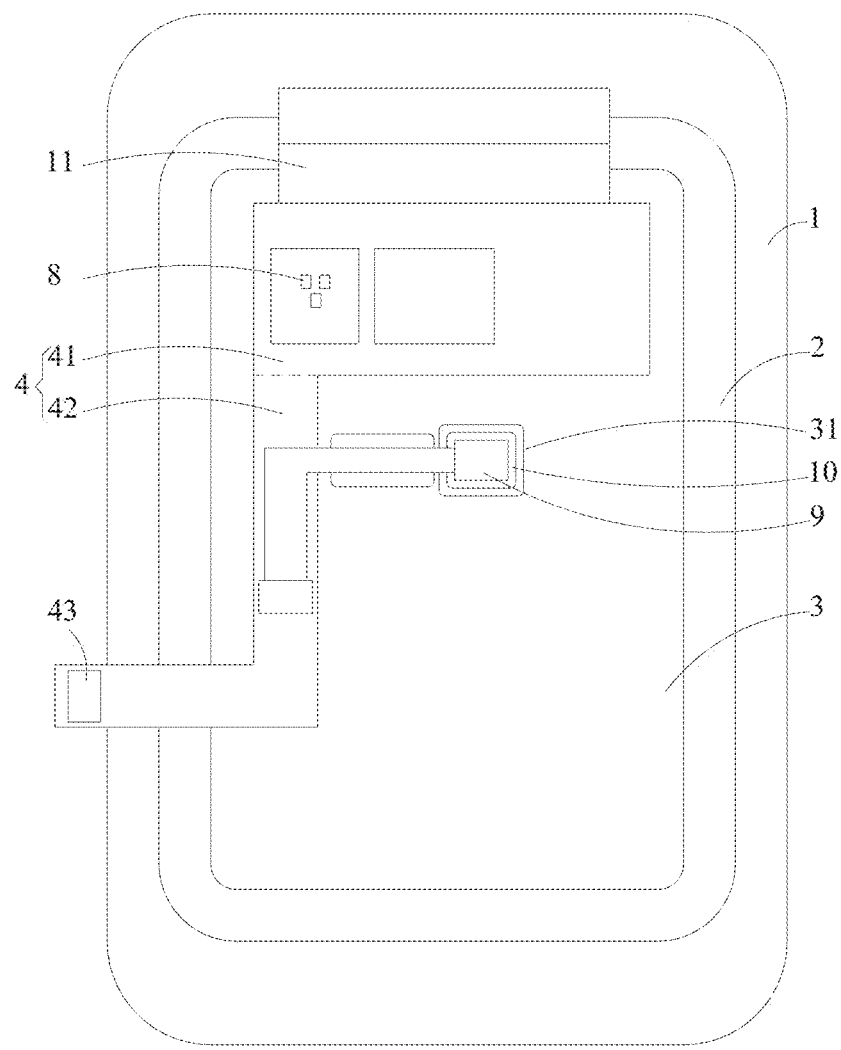
FIG. 1 is a schematic structural diagram of a display assembly in the related art.

The reference signs of the main components in the drawings are explained as follows:

1. cover plate; 2. display panel; 3. heat dissipation film; 31. via hole; 4. first flexible printed circuit; 41. component area; 42. lead area; 43. first connector; 5. second flexible printed circuit; 51. first protection layer; 521. conductor part; 522. connection part; 53. insulation layer; 54. second conductor layer; 55. second protection layer; 56. first through hole; 57. second through hole; 58. third through hole; 59. metal layer; 5*a*. second flexible printed circuit; 6. electromagnetic interference shielding layer; 7. adhesive layer; 8. electronics; 9. fingerprint sensor; 91. first segment of wire; 92. second segment of wire; 93. third segment of wire; 10. sponge rubber layer; 11. chip on film; 12. solder paste pillar; 13. first connection area; 14. second connection area; 141. third connection part; 142. fourth connection part; 15. insulation oil layer; 16. display signal line; 17. second connector.

DETAILED DESCRIPTION

Example embodiments will now be described more comprehensively with reference to the drawings. However, the example embodiments can be implemented in various ways and should not be construed as limited to the embodiments set forth herein. Instead, these embodiments are provided so that the present disclosure will be thorough and complete, and will fully convey the concept of example embodiments to those skilled in the art. The same reference signs in the drawings denote the same or similar structures. and thus their detailed descriptions will be omitted.

Reference is made to FIG. 1, and FIG. 1 illustrates a schematic structural diagram of a display assembly in the related art. After a display panel 2 is bent and folded reversely, a fingerprint sensor 9 is attached, the fingerprint sensor 9 is then fixed with a sponge rubber layer 10 surrounding it, and finally coupled to a first flexible printed circuit 4. There existed some technical disadvantages in terms of process and the space of a whole machine. The fingerprint sensor 9 is attached in individual process and is in direct contact with the display panel 2, which causes a front face of the display panel 2 to be severely impressed and cannot be fundamentally eliminated, and additional equipment and production personnel are required for the attachment of the fingerprint sensor 9, resulting in a significant increase in cost. Since the fingerprint sensor 9 is attached in individual process, it is necessary to make room for it on the whole machine, which greatly reduces the overall layout of the whole machine. As a result, the capacity of the battery cannot be further improved, and the user experience will be greatly affected.

Figure 2:
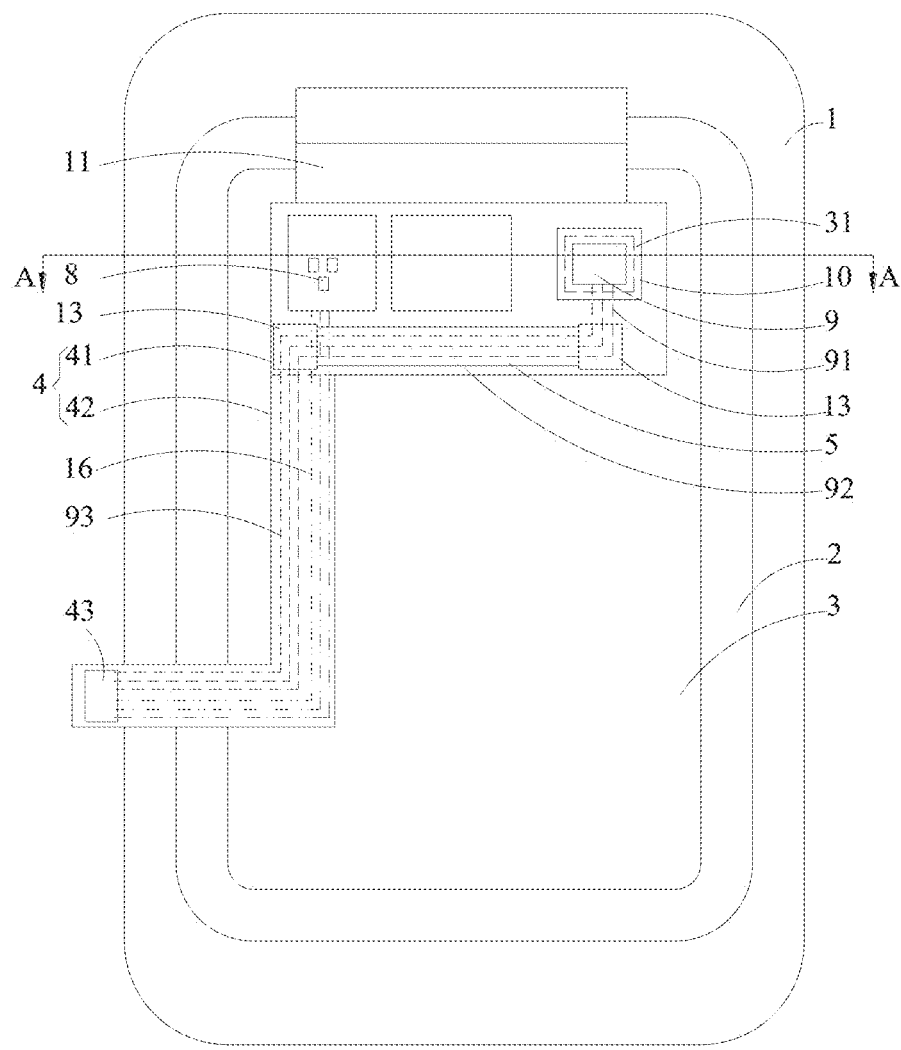
FIG. 2 is a schematic structural diagram of an example embodiment of a display assembly according to the present disclosure.
Figure 3:
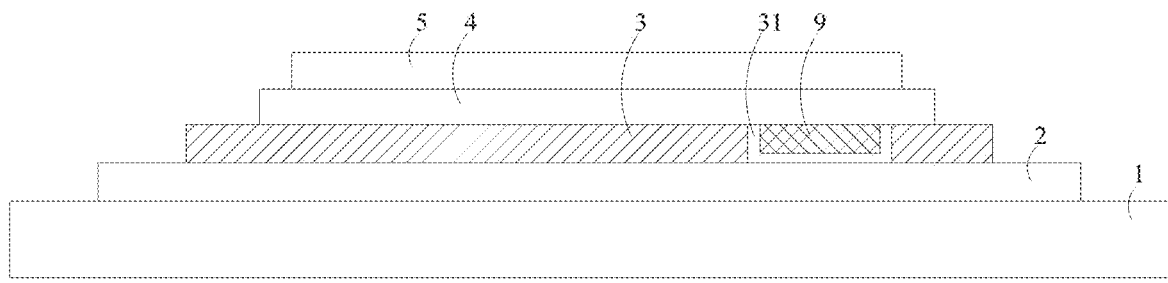
FIG. 3 is a schematic sectional view taken along A-A in FIG. 2.

The example embodiment first provides a display assembly. References are made to FIG. 2 and FIG. 3, and FIG. 2 and FIG. 3 illustrate a schematic structural diagram of an example embodiment of a display assembly according to the present disclosure. The first flexible printed circuit 4 is divided into a component area 41 and a lead area 42, as shown by the dotted line in the figure. The display assembly may include the display panel 2, the first flexible printed circuit 4 and the fingerprint sensor 9. The first flexible printed circuit 4 is provided with multiple electronics 8. The first flexible printed circuit 4 is bound to the display panel 2, and is located on a side of the display panel 2 away from a display surface. A display signal line 16 coupled to the display panel 2 is provided on the first flexible printed circuit 4. The fingerprint sensor 9 is fixed on a side of the first flexible printed circuit 4 close to the display panel 2. and a photosensitive surface of the fingerprint sensor 9 is close to the display panel 2. Herein, at least part of segments of at least part of fingerprint recognition signal lines coupled to the fingerprint sensor 9 are arranged on the first flexible printed circuit 4.

In the example embodiment, the display assembly may be a flexible OLED (Organic Light-Emitting Diode) display assembly, and obviously, it may also be an ordinary non-flexible OLED display assembly. The display panel 2 may include an array substrate and an anode, a pixel definition layer, a light-emitting layer, and a cathode (not shown in the figure), etc., arranged on the array substrate. The display assembly may also include a cover plate 1 arranged on the display panel 2 and so on.

In the example embodiment, a heat dissipation film 3 is provided on a side of the display panel 2 away from the cover plate 1, and the heat dissipation film 3 is provided thereon with a via hole 31.

In the example embodiment, one end of the display panel 2 coupled to a chip on film 11 is bent towards a side away from the cover plate 1, so that the chip on film 11 is located on the side of the display panel 2 away from the cover plate 1. Another end of the chip on film 11 is coupled to the first flexible printed circuit 4. Multiple electronics 8 are provided on the first flexible printed circuit 4 (since there are too many electronics 8 to be drawn, only three are drawn as an example).

In the example embodiment, the fingerprint sensor 9 is also arranged on a side of the first flexible printed circuit 4 close to the display panel 2, and the photosensitive surface of the fingerprint sensor 9 is close to the display panel 2. An orthographic projection of the fingerprint sensor 9 on the display panel 2 is located within an orthographic projection of the via hole 31, provided on the heat dissipation film 3, on the display panel 2, so as to avoid the shielding of the light by the heat dissipation film 3, so that a fingerprint image can pass through the via hole 31 provided on the heat dissipation film 3, and project onto the photosensitive surface of the fingerprint sensor 9, thereby realizing the fingerprint recognition. A sponge rubber layer 10 is provided around the fingerprint sensor 9, and the fingerprint sensor 9 can be protected by the sponge rubber layer 10.

The fingerprint sensor 9 is arranged on the first flexible printed circuit 4, so that the fingerprint sensor 9 and the multiple electronics 8 can be directly welded onto the first flexible printed circuit 4 through Surface Mounted Technology. Compared to the related art, no individual process for attachment is required, which saves manpower and material resources, and can avoid the impressions and indentations that occur when the fingerprint sensor 9 is assembled in the individual process. The integrated design of the fingerprint sensor 9 and the first flexible printed circuit 4 does not need to reserve installation space for the fingerprint sensor 9, which can reduce the space occupied by assembling of the whole machine, and reserve more space for the heat dissipation of the whole machine and the capacity of the battery, thereby greatly improving the user's using experience. In addition, the display signal lines 16 of the electronics 8 and the at least part of segments of the fingerprint recognition signal lines of the fingerprint sensor 9 are respectively arranged on two flexible printed circuits, so that the signal interference between the electronics 8 and the fingerprint sensor 9 can be avoided.

In the example embodiment, the first flexible printed circuit 4 may include a component area 41 and a lead area 42. The component area 41 may be provided in a rectangular shape, and the lead area 42 may be provided in a bent strip shape. Another end of the lead area 42 protrudes from the display panel 2 and is provided with a first connector 43. The first flexible printed circuit 4 is coupled to a data processor of a display apparatus through the first connector 43. Various electronics 8 can be soldered in the component area 41, and a plurality of leads are arranged in the lead area 42. The plurality of leads are coupled between the various electronics 8 and the first connector 43 to form the display signal lines 16. The various electronics 8 are arranged on a side of the component area 41 close to the lead area 42, so that it is convenient to directly arranged the display signal lines 16 of the various electronics 8 in the lead area 42 of the first flexible printed circuit 4. The fingerprint sensor 9 is arranged on a side of the component area 41 away from the lead area 42.

After the fingerprint sensor 9 is arranged on the first flexible printed circuit 4, the fingerprint recognition signal lines of the fingerprint sensor 9 also need to be coupled to the connector through the first flexible printed circuit 4. However, after the fingerprint sensor 9 is arranged in the component area 41 of the first flexible printed circuit 4, the space available in the component area 41 is reduced, and the fingerprint recognition signal lines of the fingerprint sensor 9 will be arranged close to the display signal lines 16 of the electronics 8 if the fingerprint recognition signal lines of the fingerprint sensor 9 are arranged in the component area 41, especially high frequency signal lines among the display signal lines 16, which will cause signal interference between the fingerprint sensor 9 and the electronics 8.

Therefore, in the example embodiment, the display signal lines 16 of the electronics 8 are arranged on the first flexible printed circuit 4, so that display signals are transmitted through the first flexible printed circuit 4. The display assembly may further include a second flexible printed circuit 5, and part of the segments of the fingerprint recognition signal lines of the fingerprint sensor 9 are arranged on the second flexible printed circuit 5, so that fingerprint recognition signals are transmitted through the second flexible printed circuit 5. The second flexible printed circuit 5 is fixed on a side of the first flexible printed circuit 4 away from the display panel 2, and the second flexible printed circuit 5 is located on a side of the first flexible printed circuit 4 where the component area 41 is close to the lead area 42. Obviously, in other example embodiments of the present disclosure, part of segments of the display signal lines 16 of the electronics 8 may also be arranged on the second flexible printed circuit 5, so that the display signals are transmitted through the second flexible printed circuit 5, and the fingerprint recognition signal lines of the fingerprint sensor 9 are arranged on the first flexible printed circuit 4, so that the fingerprint recognition signals are transmitted through the first flexible printed circuit 4.

Specifically. the fingerprint recognition signal lines of the fingerprint sensor 9 can be provided in three segments, namely a first segment of wire 91, a second segment of wire 92 and a third segment of wire 93 coupled successively. The first segment of wire 91 is arranged in the component area 41 of the first flexible printed circuit 4, and is directly coupled to the fingerprint sensor 9. A length of the first segment of the wire 91 is relatively short, and the signal interference between with the electronics 8 can be ignored. The second segment of wire 92 is arranged on the second flexible printed circuit 5. The third segment of wire 93 is also arranged on the first flexible printed circuit 4, and is located in the lead area 42. The lead area 42 can be provided to be relatively wide, so as to avoid the signal interference between conducting lines of the fingerprint sensor 9 and conducting lines of the electronics 8. The third segment of wire 93 is coupled to the first connector 43. The second segment of wire 92 is coupled between the first segment of wire 91 and the third segment of wire 93, and the second segment of wire 92 couples signals of the fingerprint sensor 9 that are away from the lead area 42 to the lead area 42.

The first flexible printed circuit 4 is provided thereon with two first connection areas 13. One of the first connection areas 13 is provided therein with at least two first connection parts (not shown in the figure), and the other one of the first connection areas 13 is provided therein with at least two second connection parts (not shown in the figure). The first connection parts are coupled to the fingerprint sensor, that is, the first connection parts in one of the first connection areas 13 is a connection part of the first segment of wire 91. The second connection parts in the other one of the first connection areas 13 are coupled to the first connector 43, that is, the second connection parts in the other one of the first connection areas 13 is a connection part of the third segment of wire 93.

Figure 4:
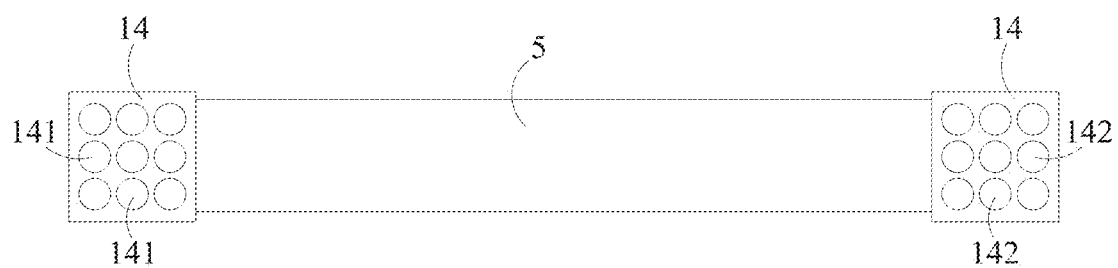
FIG. 4 is a schematic structural diagram of a second flexible printed circuit in FIG. 2.

Referring to FIG. 4, the second flexible printed circuit 5 may be provided in a long strip shape, and two second connection areas 14 are provided at both ends of the second flexible printed circuit 5. One of the second connection areas 14 is provided therein with at least two third connection parts 141, and the other one of the second connection areas 14 is provided therein with at least two fourth connection parts 142. The numbers of the third connection parts 141 and the fourth connection parts 142 can be determined as required.

In the example embodiment, the third connection parts 141 of the second flexible printed circuit 5 and the first connection parts of the first flexible printed circuit 4 are conductively coupled in one-to-one correspondence through solder paste 12. The fourth connection parts 142 of the second flexible printed circuit 5 and the second connection parts of the first flexible printed circuit 4 are conductively coupled in one-to-one correspondence through the solder paste 12.

Figure 5:
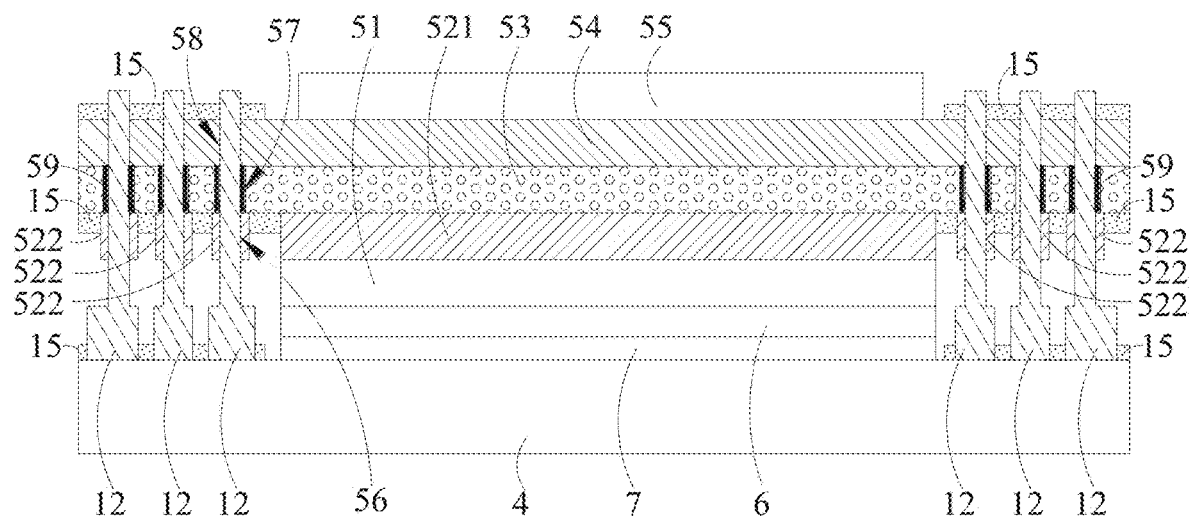
FIG. 5 is a schematic sectional view of a second flexible printed circuit and a first flexible printed circuit.

Referring to FIG. 5, the second flexible printed circuit 5 may include a first protection layer 51, a first conductor layer, an insulation layer 53, a second conductor layer 54, a second protection layer 55, and so on. The first conductor layer may include a conductor part 521 and at least two connection parts 522, and the conductor part 521 and the at least two connection parts 522 are arranged on one side of the first protection layer 51. The at least two connection parts 522 are arranged on two opposite sides of the conductor part 521. Orthographic projections of the at least two connection parts 522 on the first flexible printed circuit 4 and an orthographic projection of the first protection layer 51 on the first flexible printed circuit 4 do not overlap with each other. A gap is provided between the connection parts 522, that is, a plurality of connection parts 522 are arranged at intervals, and a gap is also provided between the connection parts 522 and the conductor part 521. First through holes 56 are provided on the connection parts 522. and the number of the first through holes 56 is the same as a sum of the number of the third connection parts 141 and the number of the fourth connection parts 142. The insulation layer 53 is arranged on a side of the first conductor layer away from the first protection layer 51, and a length of the insulation layer 53 is substantially the same as that of the first conductor layer. A plurality of second through holes 57 are respectively provided at two ends of the insulation layer 53. A metal layer 59 is formed on walls of the second through holes 57, and the metal layer 59 can be formed on the walls of the second through holes 57 by electroplating. The second through holes 57 communicate with the first through holes 56, and the metal layer 59 couples the connection part 522 and the second conductor layer 54. The second conductor layer 54 is arranged on a side of the insulation layer 53 away from the first protection layer 51. The second conductor layer 54 may include a connecting line part, that is, the second conductor layer 54 includes the second segment of the fingerprint recognition signal lines 92 of the fingerprint sensor 9. At least two third through holes 58 are respectively provided at both ends of the second conductor layer 54. The connecting line part includes a plurality of connecting lines, and both ends of each of the connecting lines are respectively coupled to the third through holes 58. That is, the third through holes 58 are located on part of the segments of the fingerprint recognition signal lines of the fingerprint sensor 9, and the third through holes 58 are located at both ends of the second segment of wire 92. The third through holes 58 communicate with the first through holes 56. The first through holes 56 and the second through holes 57 expose walls of the third through holes 58 to form the third connection part 141 and the fourth connection part 142, and the third connection part 141 and the fourth connection part 142 are the connection part of the second segment of wire 92. The second protection layer 55 is arranged on a side of the second conductor layer 54 away from the first protection layer 51, and opposite ends of the second conductor layer 54 in a length direction protrude from the second protection layer 55 to expose the third through holes 58, so that the first through holes 56, the second through holes 57 and the third through holes 58 form communicating through holes. The metal layer 59 in the second through holes 57 couples the connection part 522 of the first conductor layer and the connecting line part of the second conductor layer 54 to form the third connection part 141 and the fourth connection part 142.

The materials of the first conductor layer and the second conductor layer 54 may be copper. The material of the insulation layer 53 may be polyamide resin. The materials of the first protection layer 51 and the second protection layer 55 may be resin, plastic and other insulation materials. The conductor part 521 may be provided as a whole piece of metal sheet, that is, the conductor part 521 may be provided with no signal lines, so that the conductor part 521 may serve as a shielding layer.

When coupling the first flexible printed circuit 4 with the second flexible printed circuit 5, the solder paste may be poured into the third through holes 58, the second through holes 57 and the first through holes 56 of the second flexible printed circuit 5, so that the solder paste forms solder paste pillars 12 to couple the walls of the third through holes 58 with the first connection part or the second connection part of the first flexible printed circuit 4. The second flexible printed circuit 5 is kept in electrical connection with the first flexible printed circuit 4. An insulation oil layer 15 may be provided in the first connection area 13 of the first flexible printed circuit 4, and an insulation oil layer 15 may also be provided in the second connection area 14. The insulation oil layer 15 can avoid short circuits between adjacent solder paste pillars.

In addition, in other example embodiments of the present disclosure, the structure of the second flexible printed circuit 5 is not limited to above descriptions. For example, the second flexible printed circuit 5 may be provided in a bent shape and directly coupled to the first connector 43, and it is not necessary to provide the third segment of wire 93. The second flexible printed circuit 5 may also be coupled obliquely to a middle area of the lead area 42 of the first flexible printed circuit 4.

In the example embodiment, an electromagnetic interference shielding layer 6 may also be provided between the second flexible printed circuit 5 and the first flexible printed circuit 4, and the electromagnetic interference shielding layer 6 can further avoid the signal interference between the second flexible printed circuit 5 and the first flexible printed circuit 4.

In the example embodiment, the first flexible printed circuit 4 and the second flexible printed circuit 5 can be coupled through an adhesive layer 7. Specifically. the adhesive layer 7 is adhered between the first flexible printed circuit 4 and the electromagnetic interference shielding layer 6. Obviously, in other example embodiments of the present disclosure, the first flexible printed circuit 4 may also be adhered to the second flexible printed circuit 5 through an adhesive tape. In the case where the electromagnetic interference shielding layer 6 is not provided, the adhesive layer 7 is adhered between the first flexible printed circuit 4 and the second flexible printed circuit 5.

In the example embodiment, the first connector 43 is arranged on the first flexible printed circuit 4, the first connector 43 is coupled to the fingerprint sensor 9 and the multiple electronics 8, and signals of the fingerprint sensor 9 and the multiple electronics 8 are inputted and outputted through the first connector 43. The first connector 43 is coupled to the processor of the display apparatus. The first connector 43 may be a ZIF (Zero Insertion Force) connector, which may, of course, also be other connectors.

Figure 6:
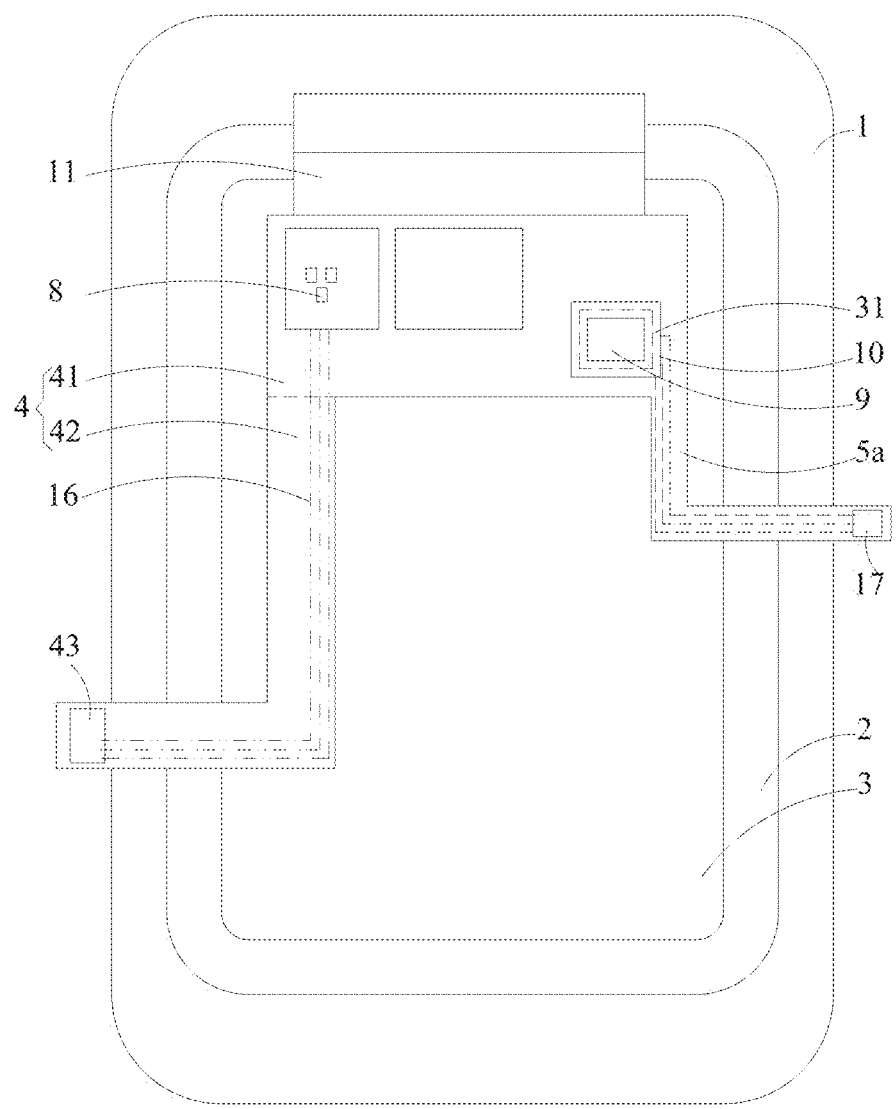
FIG. 6 is a schematic structural diagram of another example embodiment of a display assembly according to the present disclosure.

Referring to FIG. 6, in another example embodiment of the present disclosure, a second flexible printed circuit 5a and the first flexible printed circuit 4 are fabricated on the same base substrate. One end of the second flexible printed circuit 5a may be coupled to the first flexible printed circuit 4, and arranged in the same layer as at least part of the layers of the first flexible printed circuit 4, that is, it is formed simultaneously with at least part of layers of the first flexible printed circuit 4. The second flexible printed circuit 5a and the first flexible printed circuit 4 may be two functional areas of the same flexible printed circuit. A gap is provided between the second flexible printed circuit 5a and the first flexible printed circuit 4 except for coupling positions, so as to avoid the interference between the signals on the second flexible printed circuit 5a and the signals on the first flexible printed circuit 4. A second connector 17 is provided on the second flexible printed circuit 5a. the second connector 17 is coupled to the fingerprint sensor 9, and the electrical signals of the fingerprint sensor 9 are inputted and outputted through the second connector 17. The second flexible printed circuit 5a is coupled to a fingerprint recognition processor of the display apparatus through the second connector 17. The signals of the multiple electronics 8 are inputted and outputted through the first connector 43 on the first flexible printed circuit 4, and the first flexible printed circuit 4 is electrically coupled to a display drive processor through the first connector 43. The second connector 17 may be a ZIF (Zero Insertion Force) connector, which may, of course, also be other connectors.

In the example embodiment shown in FIG. 6, the second flexible printed circuit 5a and the first flexible printed circuit 4 are bent towards opposite directions. Specifically, the second flexible printed circuit 5a can be provided in an "L" shape. One end of the flexible printed circuit 5a is coupled to a side of the first flexible printed circuit 4 away from the lead area 42, bent towards the side of the first flexible printed circuit 4 away from the lead area 42, and protrudes from the side of the first flexible printed circuit 4 away from the lead area 42. The distance between the second flexible printed circuit 5a and the first flexible printed circuit 4 is relatively large, so as to further avoid the interference between the signals on the second flexible printed circuit 5a and the signals on the first flexible printed circuit 4. Obviously, in other example embodiments of the present disclosure, the second flexible printed circuit 5a and the first flexible printed circuit 4 can also be bent towards the same direction. The bending direction and various dimensions of the second flexible printed circuit 5a mainly depend on the location and the size of the space reserved.

Further, the example embodiment also provides a display apparatus, which may include any of the display assemblies described above. The specific structure of the display assembly has been described in detail above, and therefore will not be repeated here.

The specific type of the display apparatus is not particularly limited, and the type of display apparatus commonly used in the art is acceptable. For example, mobile devices such as mobile phones, wearable devices such as watches, VR devices. etc. Those skilled in the art can select respective display apparatus according to the specific use of the display apparatus. which will not be repeated here.

It should be noted that in addition to the display assembly, the display apparatus further includes other necessary components and compositions. Taking a display as an example, such as a casing, a circuit board, a power cord, etc., are included, and those skilled in the art can supplement other components according to the specific usage requirements of the display apparatus, which will not be repeated here.

Compared with the prior art, the beneficial effects provided by the display apparatus of the embodiments of the present disclosure are the same as those provided by the display assembly of the embodiments mentioned above, which is not repeated here.

The features, structures or characteristics described above may be combined in any suitable manner in one or more implementations and, where possible, the features discussed in the embodiments are interchangeable. In above descriptions, many specific details are provided in order to give a thorough understanding of the embodiments of the present disclosure. However, those skilled in the art will recognize that the technical solutions of the present disclosure may be practiced without one or more of the specific details, or by using other methods, components, materials, etc. In other instances, well-known structures, materials, or operations are not shown or described in detail to avoid obscuring aspects of the present disclosure.

Although relative terms such as "on" and "below" are used in this specification to describe the relative relationship of one illustrated component relative to another, these terms are used in this specification only for convenience, such as according to the direction of the example described in the drawings. It will be appreciated that if the illustrated device is flipped upside down, the components described as "on" will become the components "below". Other relative terms, such as "left" and "right", are also used to have similar meanings. When a certain structure is "on" an other structure, it may mean that such certain structure is integrally formed on the other structure, or that such certain structure is "directly" arranged on the other structure, or that such certain structure is "indirectly" arranged on the other structure through another structure.

In this specification, the terms "a", "an", "the" and "said" are used to indicate the presence of one or more elements/components/etc. The terms "comprising", "including" and "having" are used to indicate an open-ended inclusion and means that additional elements/components/etc., may be present in addition to the listed elements/components/etc. The terms "first", "second" and "third", etc., are used as markers only, not as restrictions on the number of objects.

It should be understood that the present disclosure does not limit its application to the detailed structure and arrangement of components set forth in this specification. The present disclosure can have other implementations and can be carried out in various ways. Variations and modifications mentioned before fall within the scope of the present disclosure. It will be understood that the disclosure disclosed and defined in this specification extends to all alternative combinations of two or more of the individual features mentioned or illustrated in the text and/or the drawings. All of these different combinations constitute various alternative aspects of the present disclosure. The embodiments described in this specification illustrate the best mode known for carrying out the disclosure, and will enable those skilled in the art to utilize the disclosure.

What is claimed is:

1. A display assembly comprising:
    a display panel;
    a first flexible printed circuit bound to the display panel, and located on a side of the display panel away from a display surface, wherein a display signal line coupled to the display panel is provided on the first flexible printed circuit; and
    a fingerprint sensor fixed on a side of the first flexible printed circuit close to the display panel, wherein a photosensitive surface of the fingerprint sensor is close to the display panel;
    wherein at least part of segments of at least part of fingerprint recognition signal lines coupled to the fingerprint, sensor are arranged on the first flexible printed circuit; and
    wherein a first connection part and a second connection part are provided on the first flexible printed circuit; and the display assembly further comprises:
    a second flexible printed circuit comprising a third connection part, a fourth connection part, and a connecting line part electrically coupling the third connection part with the fourth connection part;
    wherein the first connection part is butted with the third connection part, and the second connection part is butted with the fourth connection part.

2. The display assembly according to claim 1, wherein a display signal is transmitted through the first flexible printed circuit, and a fingerprint recognition signal is transmitted through the second flexible printed circuit; or
    the fingerprint recognition signal is transmitted through the first flexible printed circuit, and the display signal is transmitted through the second flexible printed circuit.

3. The display assembly according to claim 1, wherein the second flexible printed circuit is fixed on a side of the first flexible printed circuit away from the display panel.

4. The display assembly according to claim 1, wherein the second flexible printed circuit comprises:
    a first protection layer;
    a first conductor layer comprising a conductor part and at least two connection parts, wherein the conductor part and the at least two connection parts are arranged on one side of the first protection layer; the at least two connection parts are arranged on two opposite sides of the conductor part; a gap is provided between the connection parts and the conductor part; orthographic projections of the connection parts on the first flexible printed circuit and an orthographic projection of the first protection layer on the first flexible printed circuit do not overlap with each other; a gap is provided between the connection parts; and first through holes are provided on the connection parts;
    an insulation layer arranged on a side of the first conductor layer away from the first protection layer, wherein at least two second through holes are respectively provided at two opposite ends of the insulation layer; a metal layer is formed on walls of the second through holes; and the second through holes communicate with the first through holes;
    a second conductor layer arranged on a side of the insulation layer away from the first protection layer, wherein the second conductor layer comprises the connecting line part; at least two third through holes are respectively provided at both ends of the second conductor layer; the connecting line part comprises a plurality of connecting lines, both ends of each of the connecting lines being respectively coupled to the third through holes; and the third through holes communicate with the first through holes; and
    a second protection layer arranged on a side of the second conductor layer away from the first protection layer, wherein two opposite ends of the second conductor layer protrude from the second protection layer to expose the third through holes;
    wherein the metal layer in the second through holes couples the connection parts of the first conductor layer and the connecting line part of the second conductor layer to form the third connection part and the fourth connection part.

5. The display assembly according to claim 4, wherein the display assembly further comprises:
    solder paste pillars penetrating through the third through holes, the second through holes and the first through holes of the second flexible printed circuit, and coupled to the first flexible printed circuit, so that the second flexible printed circuit is kept in electrical connection with the first flexible printed circuit.

6. The display assembly according to claim 4, wherein the conductor part is provided as a whole piece of metal sheet.

7. The display assembly according to claim 1, wherein the display assembly further comprises:
    an electromagnetic interference shielding layer arranged between the second flexible printed circuit and the first flexible printed circuit.

8. The display assembly according to claim 7, wherein the display assembly further comprises:
    an adhesive layer arranged between the electromagnetic interference shielding layer and the first flexible printed circuit.

9. The display assembly according to claim 1, wherein the display assembly further comprises:
    a second flexible printed circuit, wherein the second flexible printed circuit and the first flexible printed circuit are fabricated on the same base substrate, and the second flexible printed circuit and at least part of layers of the first flexible printed circuit are arranged in the same layer;

wherein, the first flexible printed circuit is electrically coupled to a display drive processor through a first connector; and one end of the second flexible printed circuit is coupled to the fingerprint sensor, and the other end is electrically coupled to a fingerprint recognition processor through a second connector.

10. The display assembly according to claim 1, wherein the display assembly further comprises:
a sponge rubber layer arranged around the fingerprint sensor.

11. The display assembly according to claim 1, wherein the display assembly further comprises:
a heat dissipation film arranged between the display panel and the first flexible printed circuit, wherein a via hole is provided on the heat dissipation film, and an orthographic projection of the fingerprint sensor on the display panel is located within an orthographic projection of the via hole on the display panel.

12. A display apparatus comprising a display assembly, wherein the display assembly comprises:
a display panel;
a first flexible printed circuit bound to the display panel, and located on a side of the display panel back away from a display face, wherein a display signal line coupled to the display panel is provided on the first flexible printed circuit; and
a fingerprint sensor fixed on a side of the first flexible printed circuit close to the display panel, wherein a photosensitive surface of the fingerprint sensor is close to the display panel;
wherein at least part of segments of at least part of fingerprint recognition signal lines coupled to the fingerprint sensor are arranged on the first flexible printed circuit; and
wherein a first connection part and a second connection part are provided on the first flexible printed circuit; and the display assembly further comprises:
a second flexible printed circuit comprising a third connection part, a fourth connection part, and a connecting line part electrically coupling the third connection part with the fourth connection part;
wherein the first connection part is butted with the third connection part and the second connection part is butted with the fourth connection part.

13. The display apparatus according to claim 12, wherein a display signal is transmitted through the first flexible printed circuit; and a fingerprint recognition signal is transmitted through the second flexible printed circuit; or
the fingerprint recognition signal is transmitted through the first flexible printed circuit, and the display signal is transmitted through the second flexible printed circuit.

14. The display apparatus according to claim 12, wherein the second flexible printed circuit is fixed on a side of the first flexible printed circuit away from the display panel.

15. The display apparatus according to claim 12, wherein the second flexible printed circuit comprises:
a first protection layer;
a first conductor layer comprising a conductor part and at least two connection parts, wherein the conductor part and the at least two connection parts are arranged on one side of the first protection layer; the at least two connection parts are arranged on two opposite sides of the conductor part; a gap is provided between the connection parts and the conductor part; orthographic projections of the connection parts on the first flexible printed circuit and an orthographic projection of the first protection layer on the first flexible printed circuit do not overlap with each other; a gap is provided between the connection parts; and first through holes are provided on the connection parts;
an insulation layer arranged on a side of the first conductor layer away from the first protection layer, wherein at least two second through holes are respectively provided at two opposite ends of the insulation layer; a metal layer is formed on walls of the second through holes; and the second through holes communicate with the first through holes;
a second conductor layer arranged on a side of the insulation layer away from the first protection layer, wherein the second conductor layer comprises the connecting line part; at least two third through holes are respectively provided at both ends of the second conductor layer; the connecting line part comprises a plurality of connecting lines, both ends of each of the connecting lines being respectively coupled to the third through holes; and the third through holes communicate with the first through holes; and
a second protection layer arranged on a side of the second conductor layer away from the first protection layer, wherein two opposite ends of the second conductor layer protrude from the second protection layer to expose the third through holes;
wherein the metal layer in the second through holes couples the connection parts of the first conductor layer and the connecting line part of the second conductor layer to form the third connection part and the fourth connection part.

16. The display apparatus according to claim 15, wherein the display assembly further comprises:
solder paste pillars penetrating through the third through holes, the second through holes and the first through holes of the second flexible printed circuit, and coupled to the first flexible printed circuit, so that the second flexible printed circuit is kept in electrically coupling with the first flexible printed circuit.

17. The display apparatus according to claim 15, wherein the conductor part is provided as a whole piece of metal sheet.

18. The display apparatus according to claim 12, wherein the display assembly further comprises:
an electromagnetic interference shielding layer arranged between the second flexible printed circuit and the first flexible printed circuit.

* * * * *